United States Patent [19]

Takatsu

[11] Patent Number: 5,426,682
[45] Date of Patent: * Jun. 20, 1995

[54] SEQUENTIAL LOGIC CIRCUIT HAVING STATE HOLD CIRCUITS

[75] Inventor: Motomu Takatsu, Kawasaki, Japan

[73] Assignee: Fujitsu Limited, Kawasaki, Japan

[*] Notice: The portion of the term of this patent subsequent to May 14, 2008 has been disclaimed.

[21] Appl. No.: 797,936

[22] Filed: Nov. 26, 1991

[30] Foreign Application Priority Data

Nov. 28, 1990 [JP] Japan .................. 2-327077

[51] Int. Cl.⁶ .................. G11C 19/00; G11C 19/28
[52] U.S. Cl. .................. 377/80; 377/122; 377/127; 377/128; 326/93
[58] Field of Search .................. 307/465-466, 307/480, 272.2, 128, 480, 272.2; 357/4, 12, 16; 377/80, 106, 118-119, 122, 127, 70, 72, 73, 111; 326/37, 48, 93; 327/202

[56] References Cited

U.S. PATENT DOCUMENTS

| 3,631,260 | 12/1971 | Yoshino | 377/106 |
| 4,250,406 | 2/1981 | Alaspa | 307/205 |
| 5,015,874 | 5/1991 | Takatsu | 307/272.1 |

FOREIGN PATENT DOCUMENTS

| 0225698 | 6/1987 | European Pat. Off. . |
| 0388529 | 9/1990 | European Pat. Off. . |
| 56-129431 | 10/1981 | Japan | 377/70 |
| 2-246609 | 10/1990 | Japan . |

Primary Examiner—Edward P. Westin
Assistant Examiner—Jon Santamauro
Attorney, Agent, or Firm—Staas & Halsey

[57] ABSTRACT

A sequential logic circuit includes N state hold circuit where N is an integer. Each of the state hold circuits has a first input terminal, a second input terminal and an output terminal. The state hold circuits are cascaded via the respective first input terminals. The second input terminals of the state hold circuits receive a first clock signal. The first input terminal of one of the state hold circuits in a first stage receives a data signal. The output signal is obtained via the output terminal of one of the state hold circuits in a final stage. Each of the state hold circuits has the following truth table:

| A | B | Qn + 1 |
|---|---|--------|
| 0 | 0 | 1 or 0 |
| 0 | 1 | Qn |
| 1 | 0 | Qn |
| 1 | 1 | 0 or 1 | wherein A and B designate the respective logic level signals applied to the first and second input terminals and Qn+1 designates the respective logic level of the resultant, current output signal produced at the output terminal in response to the corresponding, current logic levels input signals A and B, Qn representing that the prior logic level output signal is maintained as the current logic level output signal.

6 Claims, 16 Drawing Sheets

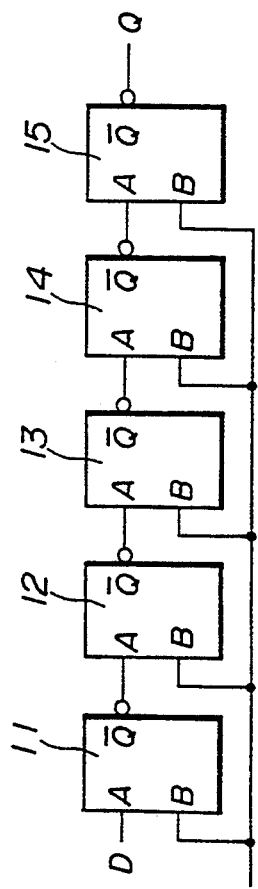
*FIG. IA*
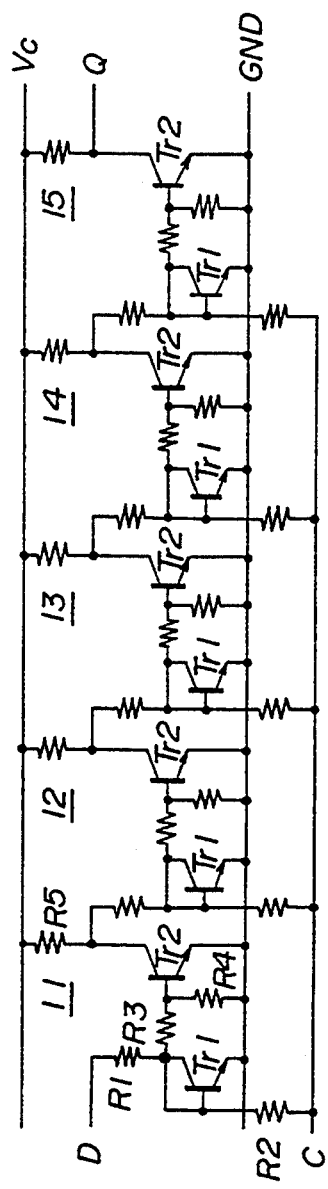
*FIG. IB*

FIG. 2A
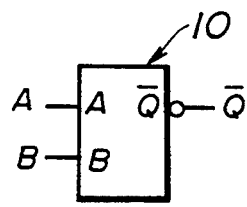
FIG. 2B
| A | B | $\overline{Q_{n+1}}$ |
|---|---|---|
| 0 | 0 | 1 |
| 0 | 1 | $\overline{Q_n}$ |
| 1 | 0 | $\overline{Q_n}$ |
| 1 | 1 | 0 |
FIG. 2C
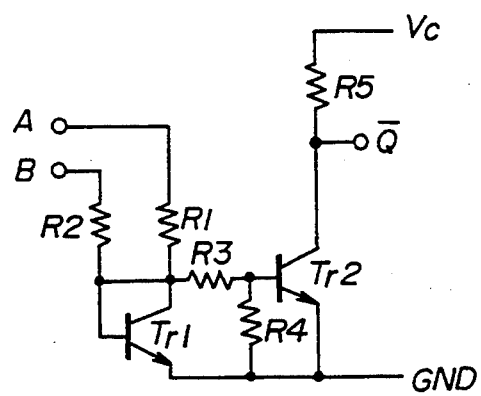
FIG. 2D
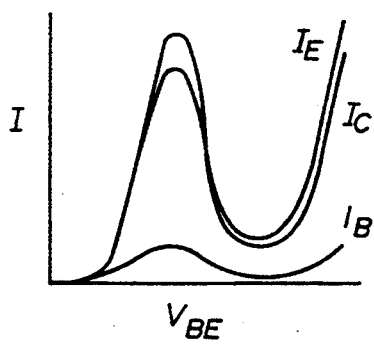
FIG. 2E
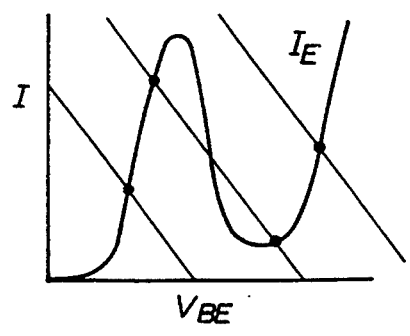

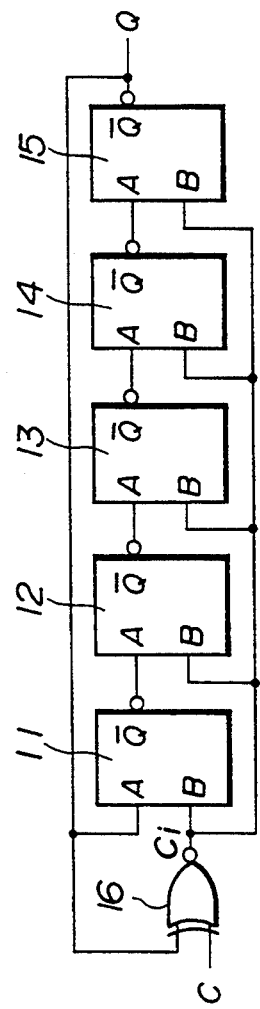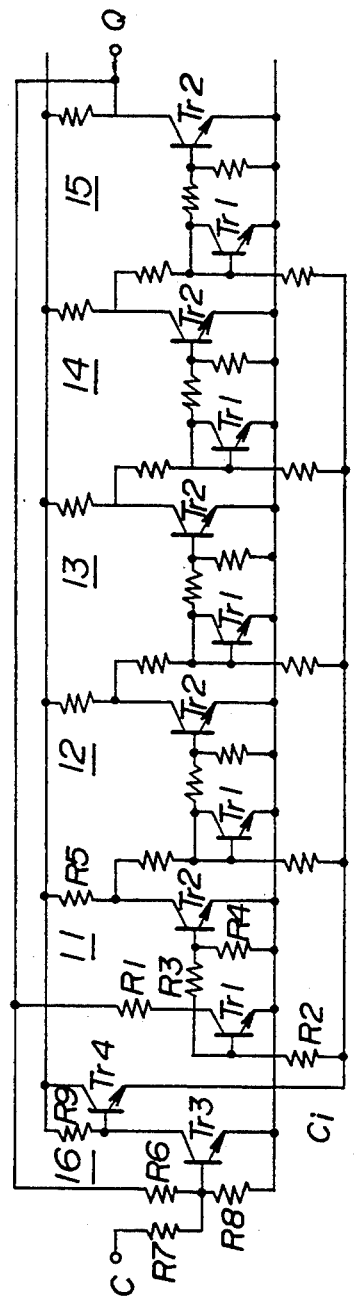
FIG. 8A
FIG. 8B

SEQUENTIAL LOGIC CIRCUIT HAVING STATE HOLD CIRCUITS

BACKGROUND OF THE INVENTION (1) Field of the Invention

The present invention generally relates to sequential logic circuits, and more particularly to a sequential logic circuit which includes state holding circuits.

(2) Description of the Prior Art

Digital logic circuits are categorized as being either a combination logic circuit or a sequential logic circuit. The combination logic circuit has an output signal which is defined by only the current state of a current input signal. The sequential logic circuit has an output signal which is defined by not only the current state of the input signal but also the previous state thereof. A basic circuit necessary to configure the sequential logic circuit is composed of a latch circuit and a flip-flop. A flip-flop can be formed by two latch circuits.

Normally, a D-type flip-flop is user to form a sequential logic circuit. Data is latched in the flip-flop via its data terminal D in synchronism with a clock signal applied to a clock terminal D thereof. As is well known, it is necessary to use a large number of normal bipolar transistors in order to hold the state of a signal. Use of a large number of bipolar transistors is disadvantageous in terms of integration density and operating speed.

It is possible to use an element having a hysteresis characteristic in order to hold the state of a signal. In principle, a single transistor having a hysteresis characteristic has the function of holding the state of a signal. However, it is impossible to form the sequential logic circuit by simply connecting transistors having hysteresis characteristics without taking into account a clock signal control procedure and an arrangement for outputting an output signal.

SUMMARY OF THE INVENTION

It is an object of the present invention to provide a sequential logic circuit formed with a small number of transistors.

The above object of the present invention is achieved as follows. A sequential logic circuit includes N state hold circuits where N is an integer. Each of the state hold circuits has a first input terminal, a second input terminal and an output terminal. The state hold circuits are cascaded via first input terminals. The second input terminals of the state hold circuits receive a first clock signal. The first input terminal of one of the state hold circuits functioning as a first stage receives a data signal. The output signal is obtained via the output terminal of one of the state hold circuits function as a final stage. Each of the state hold circuits has the following truth table:

| A | B | Qn + 1 |
|---|---|--------|
| 0 | 0 | 1 or 0 |
| 0 | 1 | Qn     |
| 1 | 0 | Qn     |
| 1 | 1 | 0 or 1 | wherein A and B designate the respective logic level signals applied to the first and second input terminals and Qn+1 designates the respective logic level of the resultant, current output signal produced at the output terminal in response to the corresponding, current logic levels input signals A and B, Qn representing that the prior logic level output signal is maintained as the current logic level output signal.

BRIEF DESCRIPTION OF THE DRAWINGS

Other objects, features and advantages of the present invention will become more apparent from the following detailed description when read in conjunction with the accompanying drawings, in which:

FIG. 1A is a block diagram of a first preferred embodiment of the present invention;

FIG. 1B is a circuit diagram of the first preferred embodiment of the present invention;

FIGS. 2A, 2B, 2C, 2D, 2E and 2F are, variously, diagrams relating to and schematics a state hold circuit used in the present invention;

FIG. 8A is a block diagram of a third preferred embodiment of the present invention;

FIG. 8B is a circuit schematic of the third preferred embodiment of the present invention shown in FIG. 8A;

DESCRIPTION OF THE PREFERRED EMBODIMENTS

Figure 2F:
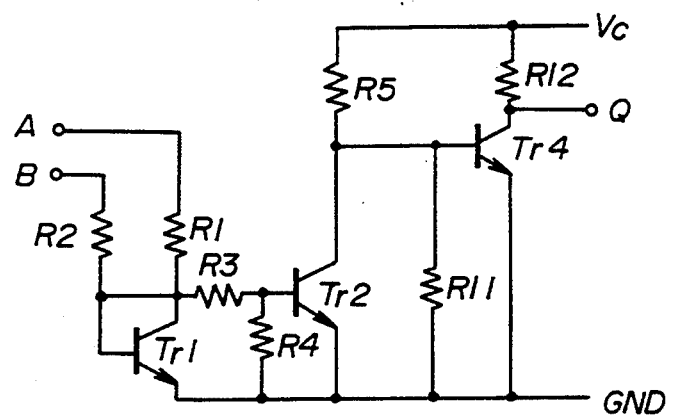

FIG. 1A is a block diagram of a sequential logic circuit according to a first preferred embodiment of the present invention, and FIG. 1B is a circuit diagram of the sequential logic circuit shown in FIG. 1A. The first preferred embodiment of the present invention is a shift register using inverted output type two-input state hold circuits.

First, a description will be given of an inverted output type two-input state hold circuit with reference to FIG. 2A. An inverted output type two-input state hold circuit 10 shown in FIG. 2A has two input terminals A and B and an inverted output terminal $\overline{Q}$. FIG. 2B shows a truth table of the state hold circuit 10 shown in FIG. 2A. The state of an output signal $\overline{Q}$ of the state hold circuit 10 is maintained when an input signal A applied to the input terminal A has a low level ("0") and an input signal B applied to the input terminal B has a high level ("1") or when the input signal A has the high level and the input signal B has the low level. The output signal $\overline{Q}$ has the high level when both the input signals A and B have the low levels. The output signal $\overline{Q}$ has a low level when both the input signals A and B have the high levels.

FIG. 2C is a circuit diagram of the state hold circuit 10 shown in FIG. 2A. The state hold circuit 10 has two resonant-tunneling hot electron transistors (RHETs) Tr1 and Tr2. As is well known, an RHET has a negative conductance. The state hold circuit 10 holds the logic state by using the negative conductance of the transistor Tr1.

FIG. 2D is a graph showing changes in an emitter current $I_E$, a collector current $I_C$ and a base current $I_B$ as a function of a base-emitter voltage $V_{BE}$ of the RHET. When the base-emitter voltage $V_{BE}$ has a certain value, the number of electrons introduced into the base from the emitter increases. Electrons introduced in the base become hot electrons, which pass through the base and reach the collector except for some electrons from which energy is lost due to scattering.

Referring again to FIG. 2C, the base of the transistor Tr1 is connected to its collector. The input terminal A is coupled, via a resistor R1, to a common node where the base and collector of the transistor Tr1 are mutually connected. The input terminal B is coupled to the common node via a resistor R2. The base of the transistor Tr2 is connected to the common node via a resistor R3. A resistor R4 is connected between the base and emitter of the transistor Tr2. The collector of the transistor Tr2 is connected to the output terminal $\overline{Q}$, and connected, via a resistor R5, to a high-potential side power supply line Vc. The emitter of the transistor Tr1 and the emitter of the transistor Tr2 are connected to a low-potential side power supply line GND.

Since the transistor T1 has the base and collector connected to each other, it functions as a diode having a characteristic shown in FIG. 2D. Assuming now that an output resistance of a previous-stage circuit does not change for the sake of simplicity, the circuit shown in FIG. 2C has an equivalent circuit in which a voltage source generating an intermediate level between the input signals A and B is coupled to the diode via a resistor having a resistance half the sum of the resistance values of the resistors R1 and R2.

The levels of the input signals A and B and the resistance values of the resistors R1 and R2 are determined as follows. As shown in FIG. 2E, a single stable point exists before a peak of a characteristic curve when both the input signals A and B are at the low level. When one of the input signals A and B is at the high level and the other input signal is at the low level, two stable points exist. A single stable point exists after the peak of the characteristic curve when both the input signals A and b at the high level.

By suitably determining the levels of the input signals A and B and the resistance values of the resistors R1 and R2, the state hold circuit 10 shown in FIG. 2C operates as follows. When the input signals A and B are at the low levels, the output signal has a voltage lower than the peak voltage. When one of the input signals A and B is at the low level and the other input signal is at the high level, the output signal has a low voltage if the previous state of the output signal has the low voltage, and has a high voltage if the previous state has the high voltage. The output signal has a voltage higher than a valley voltage if the input signals A and B are at the high level. Hence, it becomes possible to hold the logic state by designing the circuit so that the operating point is in the hysteresis range only when one of the input signals A and B is at the low level and the other input signal is at the high level.

It will be noted that the transistor Tr1 does not generate a sufficient voltage change in the output signal. The transistor Tr2 amplifies the output signal of the transistor Tr1. The transistor Tr2, which has a negative conductance, is designed so that it operates in a voltage range lower than the negative conductance range. In principle, the transistor Tr2 can be a normal bipolar transistor which has a positive conductance.

Returning to FIG. 1A, the sequential logic circuit comprises a plurality of inverted output type two-input state hold circuits 11, 12, 13, 14 and 15, which are cascaded. One of the two input terminals A and B of each of the state hold circuits 11-15 is connected to the output terminal $\overline{Q}$ of the state hold circuit of the previous stage. An input signal D is applied to the input terminal A of the (first) state hold circuit 11. The input terminal A of each of the successive state hold circuits 12-15 is connected to the output terminal $\overline{Q}$ of the state hold circuit of the respectively previous stage. An output signal Q is obtained via the output terminal $\overline{Q}$ of the state hold circuit 15 of the final stage. A clock signal C is applied to the input terminal B of each of the state hold circuits 11-15.

Each of the cascaded state hold circuits 11-15 is configured as shown in FIG. 2C. More specifically, the collector of the transistor Tr2 of the (first) state hold circuit 11 is coupled to the collector of the transistor Tr1 of the (second) state hold circuit 12 via the resistor R1. The transistor Tr2 of the second state hold circuit 12 is coupled to the collector of the transistor Tr1 of the next successive third state hold circuit 13 via the resistor R1. The collector of the transistor Tr2 of the (third) state hold circuit 13 is connected to the collector of the transistor Tr1 of the (fourth) state hold circuit 14 via the resistor R1. The collector of the transistor Tr2 of the (fourth) state hold circuit 14 is coupled to the collector of the transistor Tr1 of the (fifth) state hold circuit 15 via the resistor R1. The bases of the transistors Tr1 of the state hold circuits 11-15 are connected to each other via the respective resistors R2 through the common clock line and are supplied with the clock signal C. The input signal D is applied, via the resistor R1, to the collector of the transistor Tr1 of the (first) state hold circuit 11.

A description will now be given of the operation of the sequential logic circuit of the first embodiment with reference to FIGS. 3A through 3G and FIG. 4. FIGS. 3A through 3G show successive states of the state hold circuits 11-15, obtained after the input signal D switches to the high level, and responsive to successive clock pulse signals C from the low level.

Figure 3A:
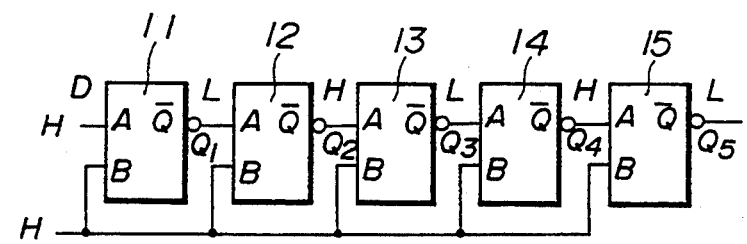
FIGS. 3A, 3B, 3C, 3D, 3E, 3F and 3G are block diagrams labelled to explain successive operating states, of the first preferred embodiment of the present invention.

When the high-level input signal D is applied to the state hold circuit 11 during a predetermined number of clock cycles, output signals Q1-Q5 of the state hold circuits 11-15 are alternately at the high and low levels, as shown in FIG. 3A.

Figure 3B:
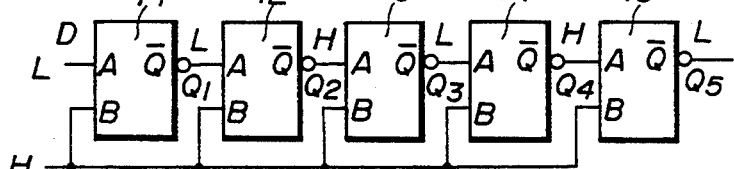
Figure 3C:
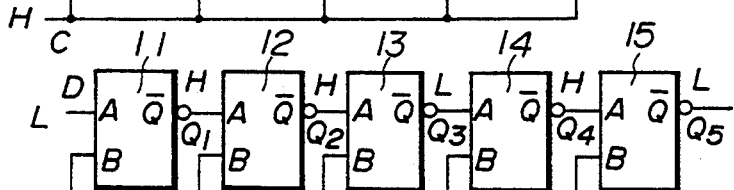

When the input signal D switches to the low level in the state where the clock signal C is at the high level, no state changes occurs, as shown in FIG. 3B. When the clock signal C switches to the low level while the input signal D is at the low level, both the input signals A and B of the state hold circuit 11 become the low level and the output signal Q1 of the state hold circuit 11 switches to the high level, as shown in FIG. 3C.

Figure 3D:
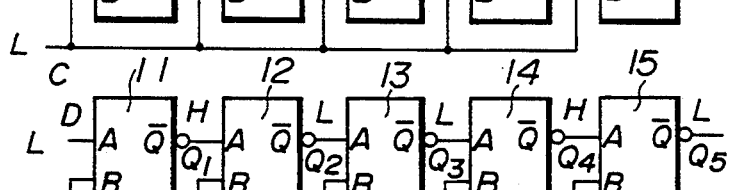
Figure 3E:
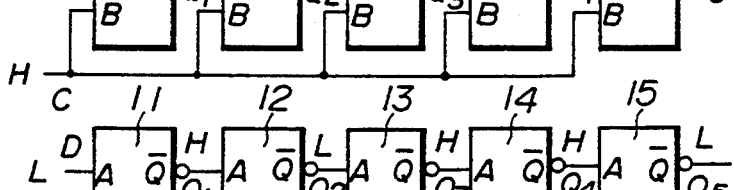

When the clock signal D switches from the low level to the high level, as shown in FIG. 3D, both the input signals A and B of the state hold circuit 12 become the high level, and the output signal Q2 thereof switches to the low level. When the clock signal C switches to the low level, as shown in FIG. 3E, both the input signals A and B of the state hold circuit 13 become the low level, and the output signal Q3 thereof switches to the high level.

Figure 3F:
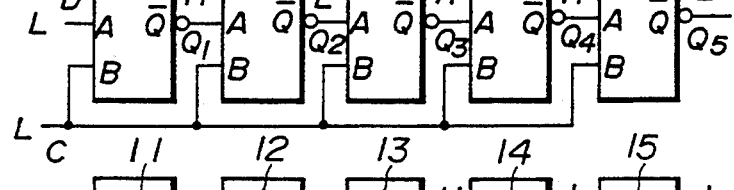
Figure 3G:
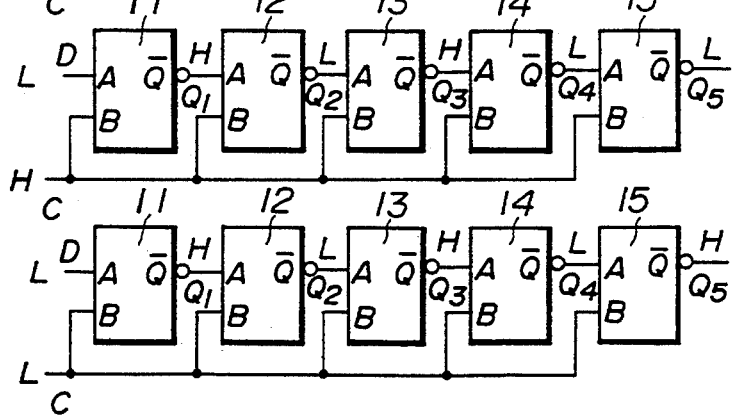
Figure 4:
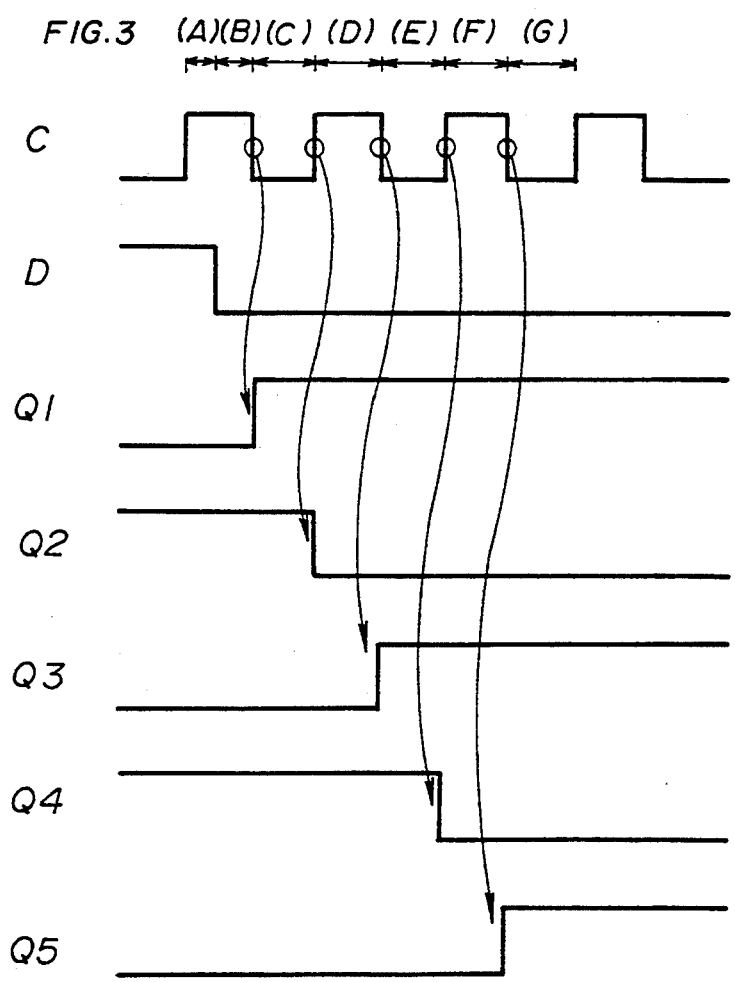
FIG. 4 is a waveform diagram of the operation of the first preferred embodiment of the present invention.

When the clock signal C switches to the high level, as shown in FIG. 3F, both the input signals A and B of the state hold circuit 14 become the high level, and the output signal Q4 thereof switches to the low level. When the clock signal C switches to the low level, as shown in FIG. 3G, both the input signals A and B of the state hold circuit 15 become the low level, and the output signal Q5 thereof switches to the high level.

A change in the input signal D to the low level is sequentially shifted one by one in synchronism with the clock signal C. After two clock cycles, the output signal Q5 of the state hold circuit 15 switches to the high level in response to the change in the input signal D to the low level. In this manner, the sequential logic circuit shown in FIGS. 1A and 1B functions as a "pseudo" shift register.

Figure 5:
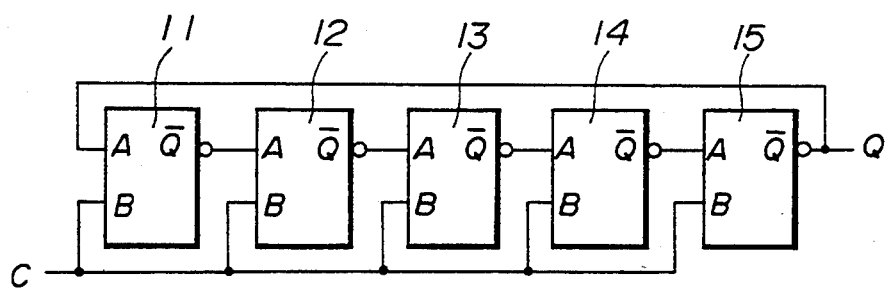
FIG. 5 is a block diagram of a second preferred embodiment of the present invention.

A description will now be given of a sequential logic circuit according to a second preferred embodiment of the present invention. FIG. 5 is a block diagram of the second preferred embodiment of the present invention. Those parts which are the same as those shown in the previously described figures are given the same reference numerals. The sequential logic circuit shown in FIG. 5 is composed of five state hold circuits 11-15. The output terminal $\overline{Q}$ of the state hold circuit 15 of the final stage is connected to the input terminal A of the state hold circuit 11 of the first stage. That is, the output signal of the (final) state hold circuit 15 is fed back to the input terminal A of the (first) state hold circuit 11. The sequential logic circuit shown in FIG. 5 functions as a frequency divider which frequency divides the clock signal C at a frequency dividing rate of 1/m where m is an odd number (m=5 when five state hold circuits are used).

A description will now be given of the operation of the second preferred embodiment shown in FIG. 5 with reference to FIGS. 6 and 7. As has been described previously, the sequential logic circuit having m cascaded state hold circuits functions as a 1/m frequency divider. For the sake of simplicity, the operation of a sequential logic circuit having three state hold circuits will be described below.

Figure 6A:
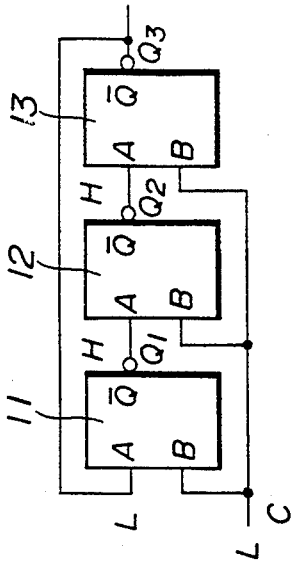
FIGS. 6A, 6B, 6C, 6D, 6E and 6F are block diagrams labelled to explain successive operating states, of the second preferred embodiment of the present invention.
Figure 6B:
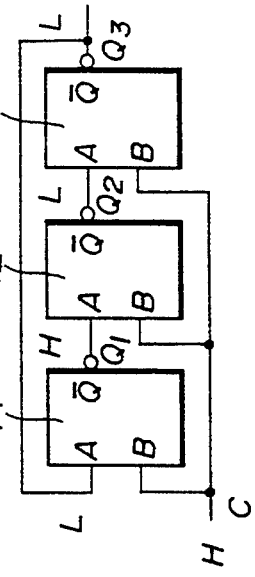

In an initial state shown in FIG. 6A, the output signal Q1 of the state hold circuit 11 is at the low level, the output signal Q2 of the state hold circuit 12 is at the low level, the output signal Q3 of the state hold circuit 13 is at the high level, and the clock signal C is at the high level. As shown in FIG. 6B, when the clock signal C switches to the low level, both the input signals A and B of the state hold circuit 12 go to the low level, and the output signal Q2 thereof switches to the high level.

Figure 6C:
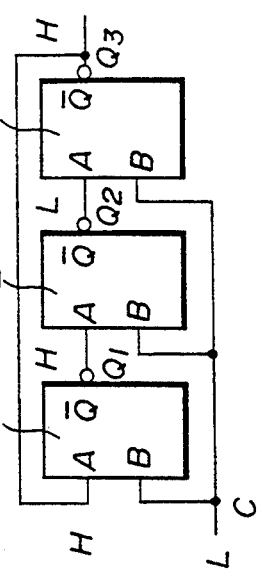
Figure 6D:
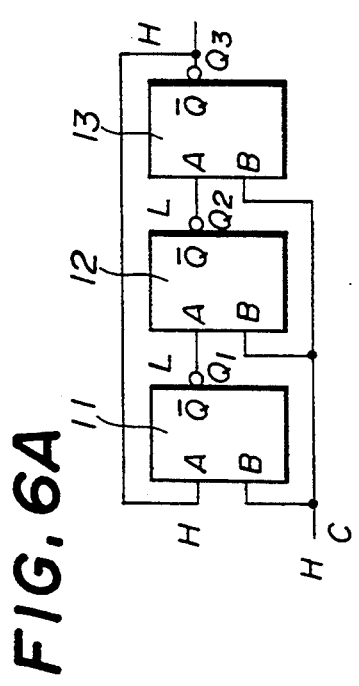

As shown in FIG. 6C, when the clock signal C switches to the high level, both the input signals A and B of the state hold circuit 13 are the high level, and the output signal Q3 thereof switches to the low level, and the input signal A of the state hold circuit 11 switches to the low level. As shown in FIG. 6D, when the clock signal C switches to the low level, both the input signals A and B of the state hold circuit 11 become the low level, and the output signal Q1 thereof switches to the high level.

Figure 6E:
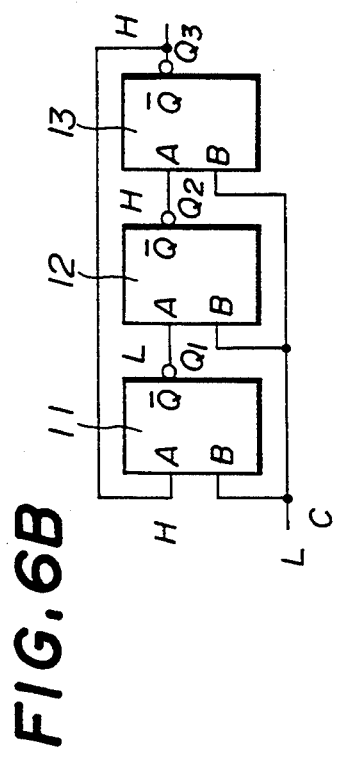
Figure 6F:
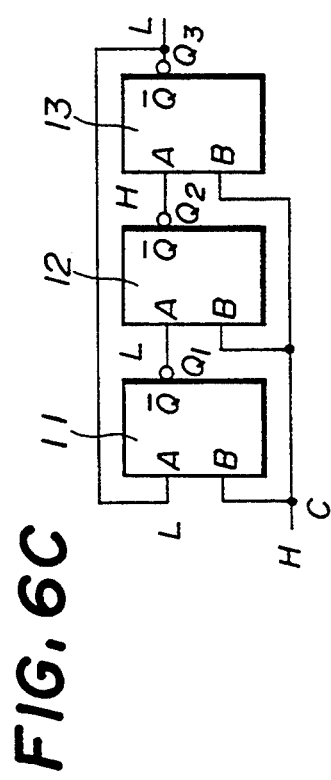

As shown in FIG. 6E, when the clock signal C switches to the high level, both the input signals A and B of the state hold circuit 12 become the high level, and the output signal Q2 thereof switches to the low level. As shown in FIG. 6F, when the clock signal C switches to the low level, both the input signals A and B of the state hold circuit 13 go to the low level, the output signal Q3 thereof switches to the high level, and the input signal A of the state hold circuit 11 switches to the high level. When the clock signal C switches to the high level, both the input signals A and B of the state hold circuit 11 become the high level, and the output signal Q1 thereof switches to the low level. Hence, the status of the circuit returns to that shown in FIG. 6A.

Figure 7:
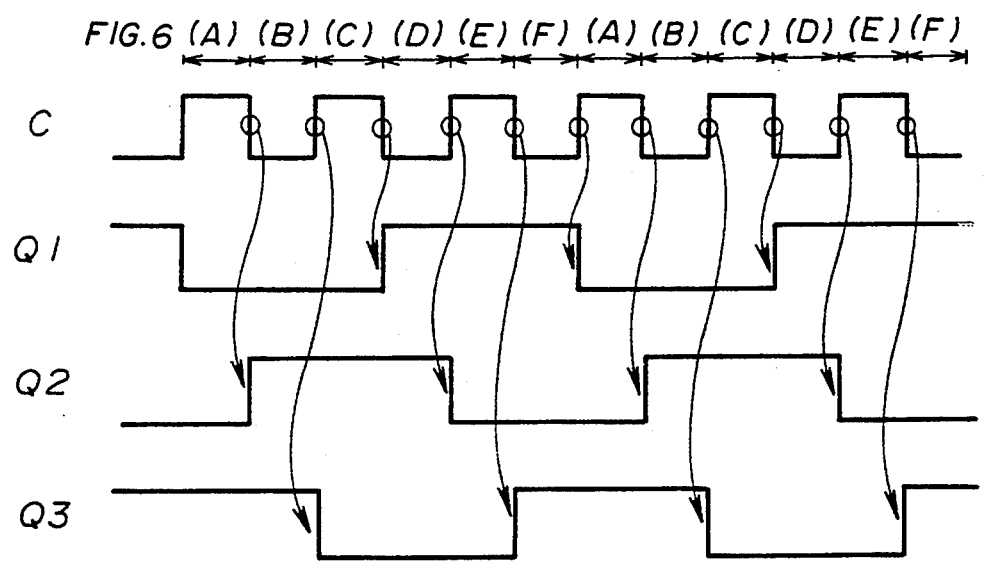
FIG. 7 is a waveform diagram of the operation of the second preferred embodiment of the present invention.

As shown in FIG. 7, the sequential logic circuit shown in FIG. 5 functions as a ⅓ frequency divider.

In the above described initial state shown in FIG. 6A, the output signals of the state hold circuits 11-13 are alternately at the low level and the high level. However, there is a possibility that the output signals of all the state hold circuits are at the low level or the high level. In this case, the output signals of all the state hold circuits are inverted in response to a change in the clock signal C, and the sequential logic circuit does not function as a frequency divider. However, in actuality, there is little possibility that the output signals of all the state hold circuits will not be inverted at the same time. The output signal of a state hold circuit which changes in advance of changes in the output signals of the other state hold circuits suppresses a change in the output signal of the state hold circuit of the subsequent stage. As a result, the generation of a parasitic loop can be prevented. However, there is a possibility that a parasitic loop will be generated when more than five state hold circuits are used. In this case, a reset circuit for setting the state of the sequential logic circuit to the initial state, as shown in FIG. 6A, can be employed.

A description will now be given of a sequential logic circuit according to a third preferred embodiment of the present invention with reference to FIGS. 8A, 8B, 9A, 9B, 10A-10F and 11. The third preferred embodiment functions as a frequency divider having a frequency dividing rate n where n is an even number. A sequential logic circuit in which an even number of cascaded state hold circuits are cascaded and the output signal of the final stage is fed back to the input signal of the first state does not function as a 1/n frequency divider. A sequential logic circuit comprising a plurality of state hold circuits, which are simply cascaded, functions as a pseudo shift register. In this configuration, data is not always shifted stage by stage due to the relationship between the data and the clock signal. With the above in mind, according to the third preferred embodiment, a 1/m frequency divider (m is an odd number) having a period longer than a necessary period is used and a state of the sequential logic circuit is skipped.

Referring to FIG. 8A, the 1/n frequency divider is composed of a 1/m frequency divider composed of an odd number of cascaded state hold circuits 11–15, and an exclusive-NOR gate 16. The exclusive-NOR gate (hereinafter simply referred to as an EX-NOR gate) 16 has a first input terminal receiving the output signal of the state hold circuit 15, and a second terminal receiving the clock signal C. An output signal of the EX-NOR gate 16 serves as an internal clock signal Ci. By using the EX-NOR gate 16, a state of the sequential logic circuit is skipped.

Figure 9B:
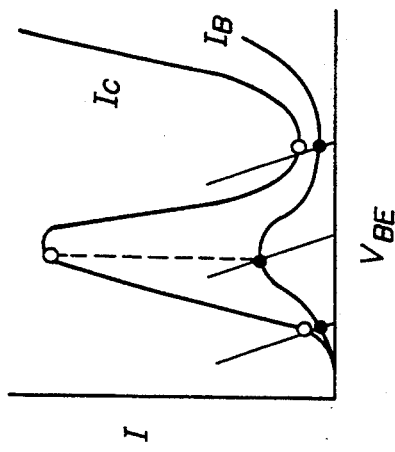
FIG. 9B is a graph showing the operation of the exclusive-NOR gate shown in FIG. 9A.
Figure 9A:
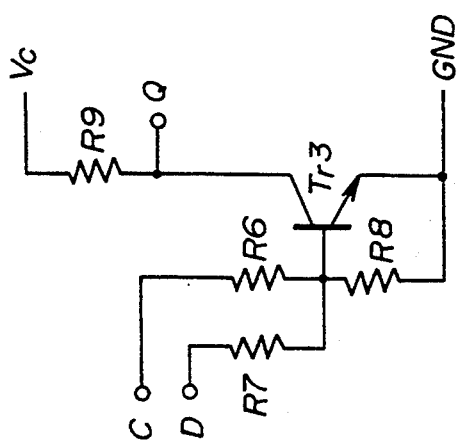
FIG. 9A is a circuit schematic of an exclusive-NOR gate used in the third preferred embodiment of the present invention.

FIG. 9A is a circuit schematic of the EX-NOR gate 16. As shown in this figure, a transistor Tr3 having a negative conductance, such as an RHET, is used. An input terminal C is coupled to the base of the transistor Tr3 via a resistor R6, and an input terminal D is coupled to the base of the transistor Tr3 via a resistor R7. The collector of the transistor Tr3 is connected to the output terminal Q and coupled to the high-potential side power supply line Vc via a resistor R9. The emitter of the transistor Tr3 is connected to the low-potential side power supply line GND. A resistor R8 is connected between the base and emitter of the transistor Tr3.

Each of the resistors R6 and R7 has a smaller resistance than an input resistance of the transistor Tr3. Thus, it is possible to consider that the transistor Tr3 is voltage-driven. If, for the sake of simplicity, an output resistance of a previous-stage circuit (not shown) does not change, it is allowed to recognize that a voltage, obtained by dividing a voltage equal to an intermediate level between the input voltage signals C and D by the resistor R8 and a resistor having a resistance half the sum of the resistance values of the resistors R6 and R7, is applied to the base of the transistor Tr3.

The level of the bias voltage (base-emitter voltage) is selected by determining the resistors R6, R7 and R8 as follows. As shown in FIG. 9B, the base-emitter voltage has a level before a rise portion of the characteristic curve when both the input signals C and D are at the low level. The base-emitter voltage has a level close to a base-emitter voltage at which a peak of the collector current is obtained when one of the input signals A and B is at the low level and the other input signal is at the high level. The base-emitter voltage has a level close to a base-emitter voltage at which a valley of the collector current is obtained when both the input signals C and D are at the high level. Hence, a large amount of current passes through the transistor only when one of the input signals C and D is at the high level and the other input signal is at the low level. In the other cases, a large amount of current does not pass, and hence the output signal Q has a high level. The above operation corresponds to an EX-NOR logic operation. As will be described later, it is possible to use an emitter follower transistor which increases the output current drive of the circuit. Use of such an emitter follower transistor is effective, particularly when a large number of cascaded state hold circuits are used.

Referring to FIG. 8B, the state hold circuits 11–15, each comprising two transistors Tr1 and Tr2, are cascaded. The output terminal of the EX-NOR gate 16, which is composed of the transistor Tr3 and an emitter follower transistor Tr4, is connected to the input terminals B of the state hold transistors 11–15. More specifically, the collector of the transistor Tr2 of the state hold circuit 11 is coupled to the collector of the transistor Tr1 of the state hold circuit 12 via the resistor R1. The collector of the transistor Tr2 of the state hold circuit 12 is coupled to the collector of the transistor Tr1 of the state hold circuit 13 via the resistor R1. The collector of the transistor Tr2 of the state hold circuit 13 is coupled to the collector of the transistor Tr1 of the state hold circuit 14 via the resistor R1. The collector of the transistor Tr2 of the state hold circuit 14 is coupled to the collector of the transistor Tr1 of the state hold circuit 15 via the resistor R1. The collector of the transistor Tr2 of the state hold circuit 15 is coupled to the base of the transistor Tr3 of the EX-NOR gate 16 via the resistor R6. The output drive of the EX-NOR gate 16 is increased by the transistor Tr4, and applied to the bases of the transistors Tr1 of the state hold circuits 11–15 via the respective resistors R2.

A description will now be given of the operation of the third preferred embodiment of the present invention with reference to FIGS. 10A–10F and 11. In the 1/n frequency divider (n is an even number) according to the third preferred embodiment of the present invention, an odd number of state hold circuits are cascaded, and the output signal obtained by the EX-NOR operation on the output signal of the state hold circuit of the final stage and the external clock signal is applied, as an internal clock signal, to all the state hold circuits. For the sake of simplicity, a ⅓ frequency divider, composed of three state hold circuits and an EX-NOR gate, will be described below.

Figure 10D:
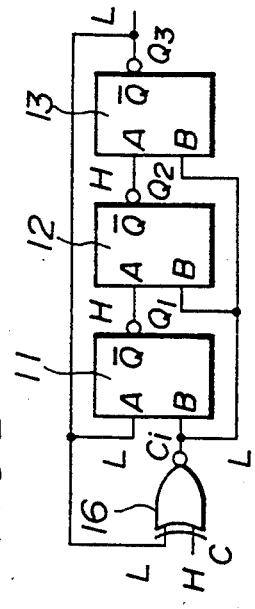
FIGS. 10A, 10B, 10C, 10D, 10E and 10F are block diagrams labelled to explain successive operating states, of the third preferred embodiment of the present invention.
Figure 10E:
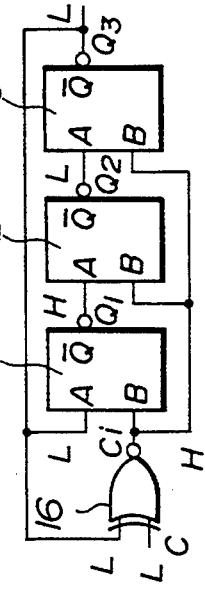
Figure 10F:
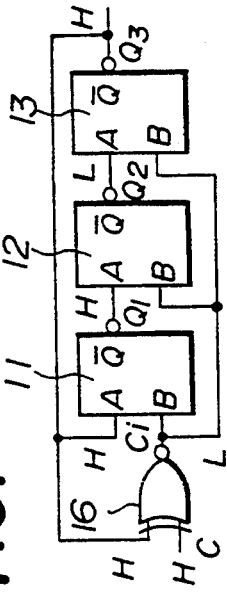
Figure 10A:
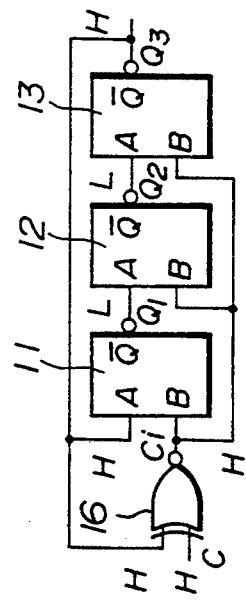

FIG. 10A shows an initial state in which the output signals Q1 and Q2 of the state hold circuits 11 and 12 are at the low level, the output signal Q3 of the state hold circuit 13 is at the high level, and the clock signal C is at the high level. The internal clock signal Ci output by the EX-NOR gate 16 is at the high level.

Figure 10B:
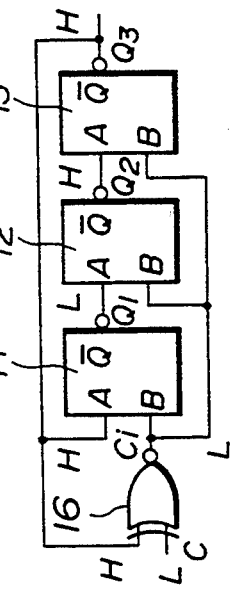

As shown in FIG. 10B, the clock signal C switches to the low level, and the internal clock signal Ci switches to the low level. Both the input signals A and B of the state hold circuit 12 become the low level, and the output signal Q2 switches to the high level.

Figure 10C:
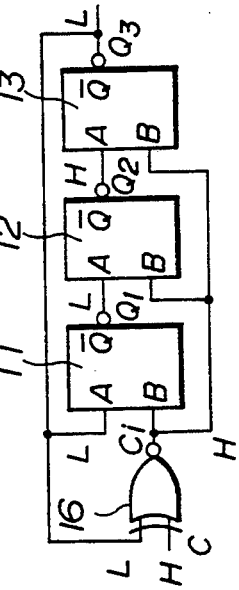

As shown in FIG. 10C, when the clock signal C switches to the high level, the internal clock signal Ci becomes the high level, and both the input signals A and B of the state hold circuit 13 become the high level. The output signal Q3 of the state hold circuit 13 switches to the low level, and the input signal of the EX-NOR gate 16 switches to the low level. As shown in FIG. 10D, the internal clock signal Ci switches to the low level again, and both the input signals A and B of the state hold circuit 11 become the low level, and the output signal Q1 switches to the high level. It can be seen from the above that in response to the change of the clock signal C from the low level to the high level, the state of the sequential logic circuit changes from the state shown in FIG. 10B to the state in FIG. 10D, while the state shown in FIG. 10C is skipped.

As shown in FIG. 10E, when the clock signal C switches to the low level, the internal clock signal Ci switches to the high level. Both the input signals A and B of the state hold circuit 12 become the high level, and the output signal Q2 switches to the low level. As shown in FIG. 10F, when the clock signal C switches to the high level, the internal clock signal Ci switches to the low level. Both the input signals A and B of the state hold circuit 13 become the low level, and the output signal Q3 switches to the high level. Then, the input signal of the EX-NOR gate 16 switches to the high level. Next, the internal clock signal Ci switches to the high level, both the input signals A and B of the state hold circuit 11 go to the high level, and the output signal Q1 switches to the low level (FIG. 10A). That is, the state of the sequential logic circuit changes from the state shown in FIG. 10E to the state shown in FIG. 10A, while the state shown in FIG. 10F is skipped.

Figure 11:
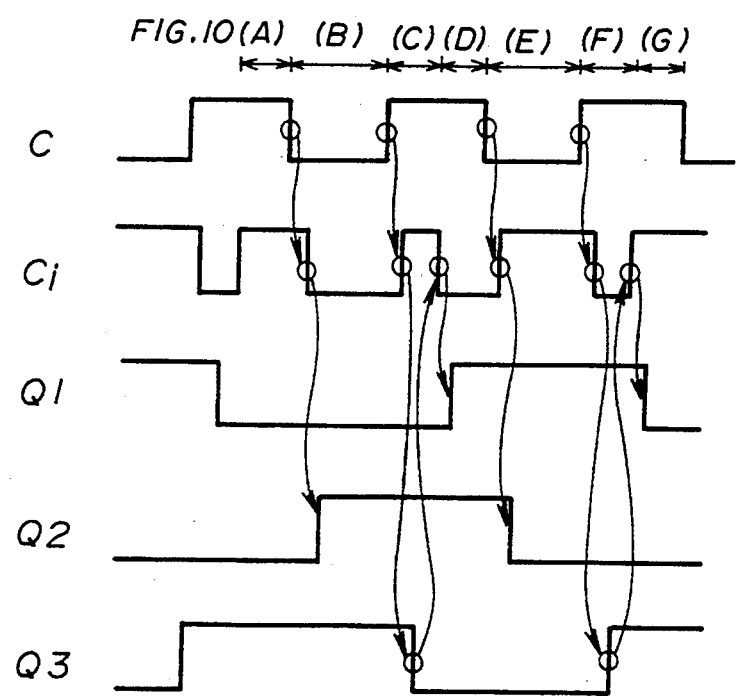
FIG. 11 is a waveform diagram showing the operation of the third preferred embodiment of the present invention.

As shown in FIG. 11, the sequential logic circuit shown in FIGS. 8A and 8B functions as a ½ frequency divider.

A description will now be given of a sequential logic circuit according to a fourth preferred embodiment of the present invention with reference to FIGS. 12, 13A–13F, and 14. In the fourth preferred embodiment of the present invention, a 1/m frequency divider (m is an odd number) is used and two states are skipped at one time by modifying the external clock signal C. With this arrangement, the sequential logic circuit of the fourth embodiment functions as an 1/n frequency divider (n is an even number).

Figure 12:
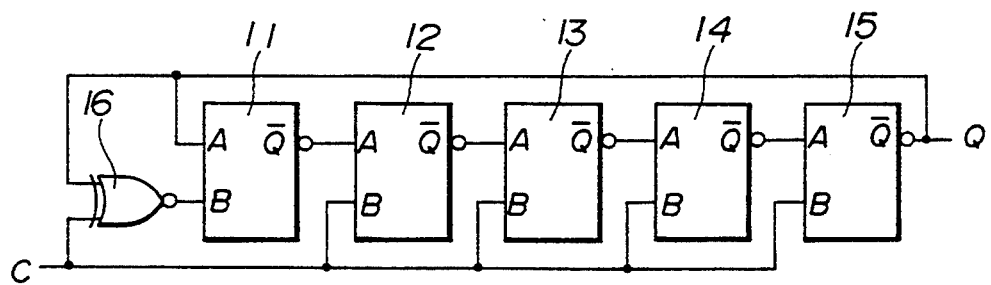
FIG. 12 is a block diagram of a sequential logic circuit according to a fourth preferred embodiment of the present invention.

Referring to FIG. 12, the sequential logic circuit comprises of a plurality of state hold circuits 11–15 and the EX-NOR gate 16. The cascaded state hold circuits 11–15 form a 1/5 frequency divider. The EX-NOR gate 16 receives the clock signal C and the output signal of the state hold circuit 15 of the final stage. The output signal of the EX-NOR gate 16 serves as the internal clock signal Ci, which is applied to only the state hold circuit 11 of the first stage. The clock signal C is applied to the input terminals B of the other state hold circuits 12–15. The sequential logic circuit shown in FIG. 12 functions as a ¼ frequency divider.

Figure 13A:
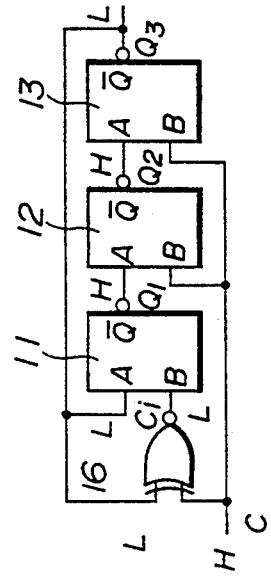
FIGS. 13A, 13B, 13C, 13D, 13E, and 13F are block diagrams labelled to explain successive operating states, of the fourth preferred embodiment of the present invention.

A description will now be given of the operation of the sequential logic circuit shown in FIG. 12. FIG. 13A shows an initial state in which the output signals Q1 and Q2 of the state hold circuits 11 and 12 are at the low level, the output signal Q3 of the state hold circuit 13 is at the high level, and the clock signal C is at the high level. The internal clock signal Ci output by the EX-NOR gate 16 is at the high level.

Figure 13D:
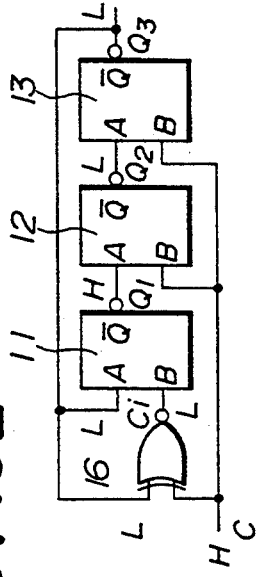
Figure 13E:
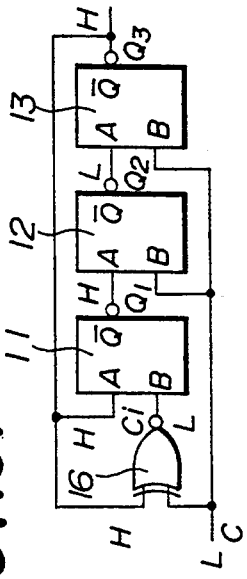
Figure 13B:
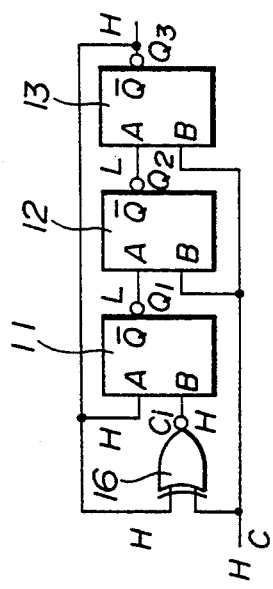

As shown in FIG. 13B, when the clock signal C switches to the low level, the internal clock signal Ci switches to the low level, and both the input signals A and B of the state hold circuit 12 become the low level. Further, the output signal Q2 of the state hold circuit 12 switches to the high level.

Figure 13C:
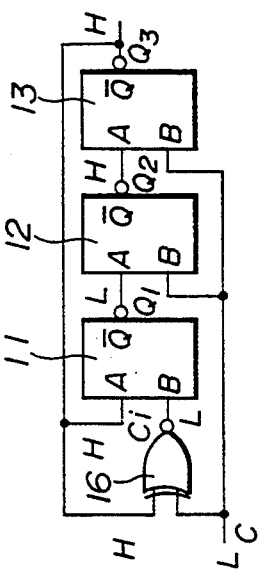

As shown in FIG. 13C, when the clock signal C switches to the high level, the internal clock signal Ci switches to the high level, and both the input signals A and B of the state hold circuit 13 become the high level. Further, the output signal Q3 of the state hold circuit 13 switches to the low level, and the input signal of the EX-NOR gate 16 switches to the low level. As shown in FIG. 13D, the internal clock signal Ci switches to the low level again, and both the input signals A and B of the state hold circuit 11 become the low level. Then, the output signal Q1 of the state hold circuit 11 switches to the high level. As shown in FIG. 13E, both the input signals A and B of the state hold circuit 12 become the high level, and the output signal Q2 thereof switches to the low level. That is, in response to the change in the clock signal from the low level to the high level, the state of the sequential logic circuit changes from the state shown in FIG. 13B to the state in FIG. 13E in the state where the states in FIGS. 13C and 13D are skipped.

Figure 13F:
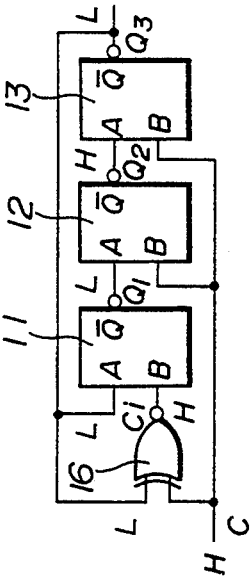

As shown in FIG. 13F, when the clock signal C switches to the low level, the internal clock signal Ci switches to the high level, and both the input signals A and B of the state hold circuit 13 become the low level. Further, the output signal Q3 of the state hold circuit 13 switches to the high level, and the input signal of the EX-NOR gate 16 switches to the high level.

Figure 14:
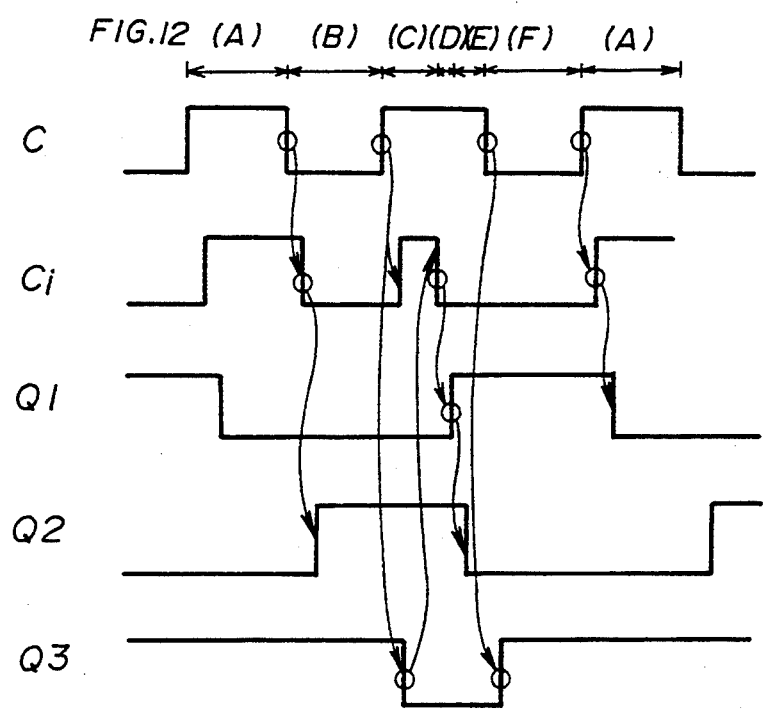
FIG. 14 is a waveform diagram showing the operation of the fourth preferred embodiment of the present invention.

AS shown in FIG. 14, the sequential logic circuit shown in FIG. 12 functions as a ½ frequency divider which frequency-divides the clock signal C at a frequency dividing rate of ½.

Various variations of the previously described embodiments can be made. It is possible to use a non-inverted output type two input state hold circuit instead of the inverted output type two input state hold circuit. When the non-inverted output type two input state hold circuit is used, two adjacent state hold circuits in the cascaded configuration are driven by different clock signals, one of which is the inverted version of the other. When both the input signals A and B of the non-inverted output type state hold circuit are "0" the output signal thereof is "0". When both the input signals A and B of the non-inverted output type state hold circuit are "1", the output signal thereof is "1".

FIG. 2F is a circuit diagram of the non-inverted output type two-input state hold circuit. In FIG. 2F, those parts which are the same as those shown in FIG. 2C are given the same reference numerals. As shown in FIG. 2F, a transistor Tr4 and two resistors R11 and R12 are added to the circuit configuration shown in FIG. 2C. The resistor R11 is connected between the base and emitter of the transistor Tr4. The resistor R12 is connected to the collector of the transistor Tr4 and the high-potential side power supply line Vc. The collector of the transistor Tr4 defines the output terminal Q.

Figure 15A:
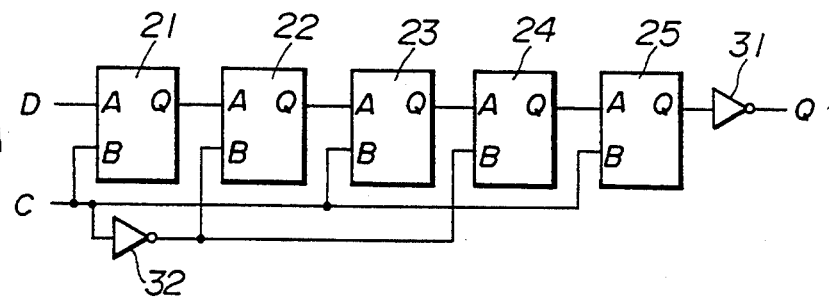
FIGS. 15A, 15B, 15C and 15D are block diagrams of variations of the first, second, third and fourth preferred embodiments of the present invention, respectively.

FIG. 15A shows a variation of the pseudo shift register according to the first preferred embodiment of the present invention. Non-inverted output type two-input state hold circuits 21–25 are cascaded, and two inverters 31 and 32 are connected, as shown in FIG. 15A. The clock signal C is applied to the input terminals B of the state hold circuits 21, 23 and 25, and an inverted version of the clock signal C output by the inverter 32 is applied to the input terminals B of the state hold circuits 22 and 24.

Figure 15B:
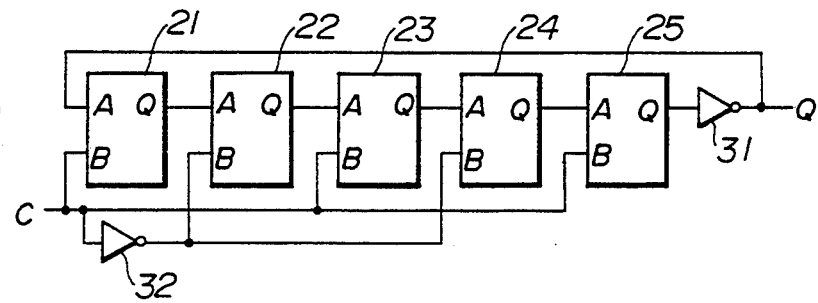
Figure 15C:
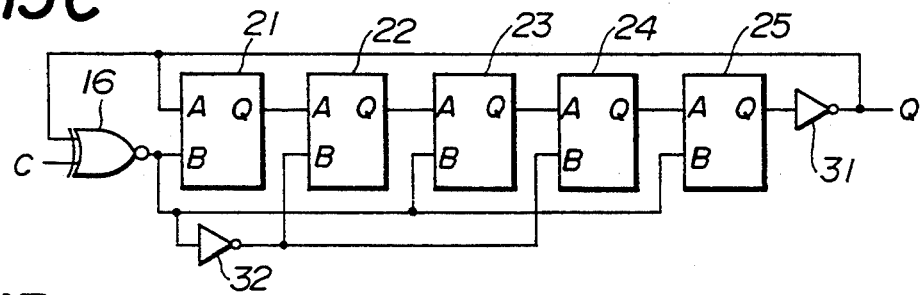
Figure 15D:
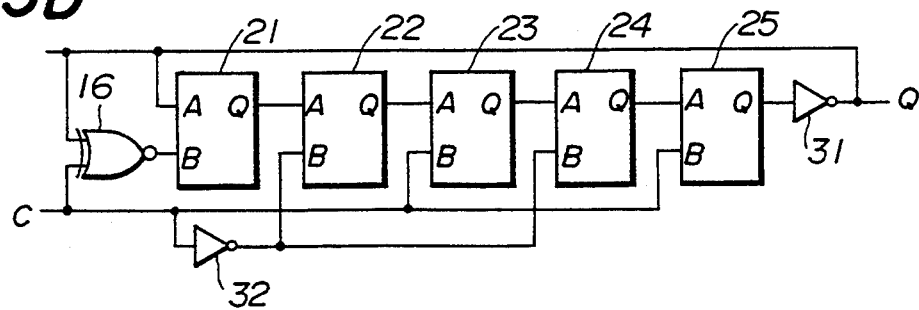

FIG. 15B shows a variation of the 1/m frequency divider (m is an odd number) according to the second preferred embodiment of the present invention. FIG. 15C shows a variation of the 1/n frequency divider (n is an even number) according to the third preferred embodiment of the present invention, and FIG. 15D shows a variation of the 1/n frequency divider according to the fourth preferred embodiment of the present invention.

It is possible to form the state hold circuit with elements other than the combination of the RHETs and resistors. For example, a resonant tunneling bipolar transistor can be used. In another example, a combination of a transistor and a two-terminal negative conductance element, such as a resonant-tunneling diode or an Esaki diode, can be used. It is also possible to obtain the negative conductance by means of a positive feedback structure, such as one in which a Schmitt trigger gate is used.

It is also possible to use a multi-input state hold circuit having three or more input terminals, as shown in FIG.

Figure 16A:
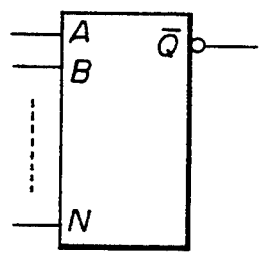
FIGS. 16A and 16B are block diagrams of multi-input state hold circuits.
Figure 16B:
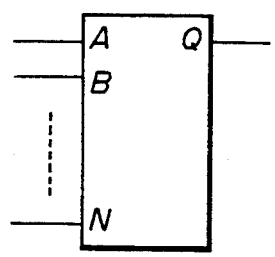

16A or FIG. 16B. When the number of high-level input signals among all the input signals is within a predetermined range, the multi-input state hold circuit maintains the previous level of the output signal. When the number of high-level input signals is greater than the upper limit of the predetermined range, the multi-input state hold circuit outputs a high or low level. When the number of high-level input signals is smaller than the lower limit of the predetermined range, the multi-input state hold circuit outputs a low or high level.

The present invention is not limited to the specifically disclosed embodiments, and variations and modifications may be made without departing from the scope of the present invention.

What is claimed is:

1. A sequential logic circuit comprising:

N state hold circuits where N is an odd number integer, each of the state hold circuits having a first input terminal, a second input terminal and an output terminal, the state hold circuits being cascaded via the respective first input terminals thereof as a succession of respective stages, from a first stage to a final stage, the respective second input terminals of the state hold circuits each receiving a first clock signal, the first input terminal of the state hold circuit of the first stage receiving a data signal and an output signal being produced at the output terminal of the state hold circuit of the final stage;

each of the state hold circuits implementing the following truth table:

| A | B | $Q_N + 1$ |
|---|---|---|
| 0 | 0 | 1 |
| 0 | 1 | $Q_N$ |
| 1 | 0 | $Q_N$ |
| 1 | 1 | 0 | wherein A and B designate the respective logic level signals applied to the first and second input terminals and $Q_N+1$ designates the logic level of the resultant, current output signal produced at the output terminal in response to the corresponding, current logic level input signals A and B, the logic level $Q_N$ representing that the prior logic level output signal is maintained as the current logic level output signal;

the output terminal of said state hold circuit of the final stage being connected to the first input terminal of said state hold circuit of the first stage, so that the data signal is the output signal produced at the output terminal of said state hold circuit of the final stage;

an exclusive-NOR gate having a first input terminal receiving the output signal produced at the output terminal of said state hold circuit of the final stage, a second input terminal receiving an external clock signal, and an output terminal at which the first clock signal is generated and output thereby; and the sequential logic circuit accordingly functioning as a $1/(N-1)$ frequency divider which frequency-divides the external clock signal.

2. A sequential logic circuit comprising:

N state hold circuits where N is an odd number integer, each of the state hold circuits having a first input terminal, a second input terminal and an output terminal, the state hold circuits being cascaded via the respective first input terminals thereof as a succession of respective stages, from a first stage to a final stage, the respective second input terminals of the state hold circuits of the second through the final stages each receiving a first clock signal, the first input terminal of the state hold circuit of the first stage receiving a data signal and an output signal being produced at the output terminal of the state hold circuit of the final stage;

each of the state hold circuits implementing the following truth table:

| A | B | $Q_n + 1$ |
|---|---|---|
| 0 | 0 | 1 or 0 |
| 0 | 1 | $Q_n$ |
| 1 | 0 | $Q_n$ |
| 1 | 1 | 0 or 1 | wherein A and B designate the respective logic level signals applied to the first and second input terminals and $Q_n+1$ designates the respective logic level of the resultant, current output signal produced at the output terminal in response to the corresponding, current logic level input signals A and B, $Q_n$ representing that the prior logic level output signal is maintained as the current logic level output signal;

the output terminal of said state hold circuit of the final stage being connected to the first input terminal of said state hold circuit of the first stage, so that the data signal is the output signal produced at the output terminal of said state hold circuit of the final stage;

said sequential logic circuit further comprising an exclusive-NOR gate having a first input terminal receiving the output signal produced at the output terminal of said state hold circuit of the final stage, a second input terminal receiving said first clock signal, and an output terminal at which a second clock signal, which is generated thereby, is output and applied to the second input terminal of said state hold circuit of the first stage; and the sequential logic circuit accordingly functioning as a $1/(N-1)$ frequency divider which frequency-divides the first clock signal.

3. A sequential logic circuit comprising:

N state hold circuits where N is an integer, each of the state hold circuits having a first input terminal, a second input terminal and an output terminal, the state hold circuits being cascaded via the respective first input terminals thereof as a succession of respective stages, from a first stage to a final stage, two adjacent state hold circuits, of the N state hold circuits, respectively receiving, in alternating succession, the first clock signal and the inverted version thereof via the respective second input terminals of said two adjacent state hold circuits, the first input terminal of the state hold circuit of the first stage receiving a data signal and an output signal being produced at the output terminal of the state hold circuit of the final stage;

each of the state hold circuits implementing the following truth table:

| A | B | $Q_N + 1$ |
|---|---|---|
| 0 | 0 | 0 |
| 0 | 1 | $Q_N$ |
| 1 | 0 | $Q_N$ |
| 1 | 1 | 1 | wherein A and B designate the respective logic level signals applied to the first and second input terminals and $Q_{N+1}$ designates the logic level of the resultant, current output signal produced at the output terminal in response to the corresponding, current logic level input signals A and B, the logic level $Q_N$ representing that the prior logic level output signal is maintained as the current logic level output signal;

an inverter which generates an inverted version of said first clock signal;

the first terminal of said one state hold circuit of the first stage receiving the data signal supplied from an external circuit, and the sequential logic circuit accordingly functioning as a shift register.

4. A sequential logic circuit comprising:

N state hold circuits where N is an integer, each of the state hold circuits having a first input terminal, a second input terminal and an output terminal, the state hold circuits being cascaded via the respective first input terminals thereof as a succession of respective stages, from a first stage to a final stage, two adjacent state hold circuits, of the N state hold circuits, respectively receiving, in alternating succession, the first clock signal and the inverted version thereof at the respective second input terminals of said two adjacent state hold circuits, the first input terminal of the state hold circuit of the first stage receiving a data signal and an output signal being produced at the output terminal of the state hold circuit of the final stage;

each of the state hold circuits implementing the following truth table:

| A | B | $Q_N + 1$ |
|---|---|---|
| 0 | 0 | 0 |
| 0 | 1 | $Q_N$ |
| 1 | 0 | $Q_N$ |
| 1 | 1 | 1 | wherein A and B designate the respective logic level signals applied to the first and second input terminals and $Q_{N+1}$ designates the logic level of the resultant, current output signal produced at the output terminal in response to the corresponding, current logic level input signals A and B, the logic level $Q_N$ representing that the prior logic level output signal is maintained as the current logic level output signal, and comprising:

a first two terminal negative conductance device which conducts current unidirectionally from the first to the second terminal, a first resistor and a second resistor, the first terminal thereof being coupled by the first and second resistors to the first and second input terminals, respectively, of the state hold circuit and the second terminal thereof being connected to a predetermined voltage source and the two terminal negative conductance device producing an output signal at the first terminal thereof, third and fourth resistors, connected in series at a connection node, and the series-connected third and fourth resistors further being connected between the first terminal of the first two terminal negative conductives device and the predetermined voltage source, and amplifier means, having an input terminal connected to the connection node, for receiving and amplifying the output signal produced at the first terminal of the first two terminal negative conductance device and for outputting the amplified signal at the output terminal of the state hold circuit, said amplifier means comprising a second two terminal negative conductance device and the respective values of the third and fourth resistors being selected to cause said second two terminal negative conductance device to operate in a linear range;

a first inverter connected between the output terminal of said state hold circuit of the final stage and the first input terminal of said state hold circuit of the first stage, so that the data signal is an inverted version of the output signal produced at the output terminal of said state hold circuit of the final stage;

a second inverter which generates an inverted version of said first clock signal; and the first input terminal of said state hold circuit of the first stage receiving an inverted version of the output signal of the final stage, and the sequential logic circuit accordingly functioning as a 1/N frequency divider which frequency-divides the first clock signal.

5. A sequential logic circuit comprising:

N state hold circuits where N is an integer, each of the state hold circuits having a first input terminal, a second input terminal and an output terminal, the state hold circuits being cascaded via the respective first input terminals thereof as a succession of respective stages, from a first stage to a final stage, two adjacent state hold circuits, of the N state hold circuits, respectively receiving, in alternating succession, the first clock signal and the inverted version thereof at the respective second input terminals of said two adjacent state hold circuits, the first input terminal of the state hold circuit of the first stage receiving a data signal and an output signal being produced at the output terminal of the state hold circuit of the final stage;

each of the state hold circuits implementing the following truth table:

| A | B | $Q_N + 1$ |
|---|---|---|
| 0 | 0 | 0 |
| 0 | 1 | $Q_N$ |
| 1 | 0 | $Q_N$ |
| 1 | 1 | 1 | wherein A and B designate the respective logic level signals applied to the first and second input terminals and $Q_{N+1}$ designates the logic level of the resultant, current output signal produced at the output terminal in response to the corresponding, current logic level input signals A and B, the logic level $Q_N$ representing that the prior logic level output signal is maintained as the current logic level output signal, and comprising:

a first two terminal negative conductance device which conducts current unidirectionally from the first to the second terminal, a first resistor and a second resistor, the first terminal thereof being coupled by the first and second resistors to the first and second input terminals, respectively, of the state hold circuit and the second terminal thereof being connected to a predetermined voltage source and the two terminal negative conductance device producing an output signal at the first terminal thereof, third and fourth resistors, connected in series at a connection node, and the series-connected third and fourth resistors further being connected between the first terminal of the first two terminal negative conductives device and the predetermined voltage source, and amplifier means, having an input terminal connected to the connection node, for receiving and amplifying the output signal produced at the first terminal of the first two terminal negative conductance device and for outputting the amplified signal at the output terminal of the state hold circuit, said amplifier means comprising a second two terminal negative conductance device and the respective values of the third and fourth resistors being selected to cause said second two terminal negative conductance device to operate in a linear range;

a first inverter connected between the output terminal of said state hold circuit of the final stage and the first input terminal of said state hold circuit of the first stage, so that the data signal is an inverted version of the output signal produced at the output terminal of said state hold circuit of the final stage;

an exclusive-NOR gate having a first input terminal receiving the inverted version of the output signal produced at the output terminal of said state hold circuit of the final stage, a second input terminal receiving an external clock signal, and an output terminal at which the first clock signal is generated thereby;

a second inverter which generates an inverted version of said first clock signal;

two adjacent state hold circuits, of the N state hold circuits, respectively receiving the first clock signal and the inverted version thereof at the respective second input terminals of said two adjacent state hold circuits; and the sequential logic circuit accordingly functioning as a $1/(N-1)$ frequency divider which frequency-divides the external clock signal.

6. A sequential logic circuit as claimed in claim 2, further comprising:

a first inverter connected between the output terminal of said state hold circuit of the final stage and the first input terminal of said state hold circuit of the first stage, so that the data signal is an inverted version of the output signal produced at the output terminal of said state hold circuit of the final stage;

the first input terminal of said exclusive-NOR gate receiving the inverted version of the output signal produced at the output terminal of said state hold circuit of the final stage;

a second inverter which generates an inverted version of said first clock signal;

two adjacent state hold circuits, of the N state hold circuits, respectively receiving the first clock signal and the inverted version thereof at the respective second input terminals of said two adjacent state hold circuits; and the sequential logic circuit accordingly functioning as a $1/(N-1)$ frequency divider which frequency-divides the first clock signal.

* * * * *

UNITED STATES PATENT AND TRADEMARK OFFICE
CERTIFICATE OF CORRECTION

PATENT NO. : 5,426,682
DATED : June 20, 1995
INVENTOR(S) : TAKATSU

It is certified that error appears in the above-indentified patent and that said Letters Patent is hereby corrected as shown below:

TITLE PAGE: [56] References Cited, add the following:

OTHER PUBLICATIONS

IMAMURA, K., "Full Adder Uses RHETs," JEE JOURNAL OF ELECTRONIC ENGINEERING, Vol. 28, No. 299, Nov. 1991, Tokyo, JP, pages 76-80 (XP273338).

Col. 2, line 15, after "schematics" insert --of,--.

Col. 4, line 50, change "third" to --(third)--.

Col. 11, Claim 1, lines 3 and 4 of the truth table, change "$Q_N$" to --$\overline{Q}_N$-- (both occurrences, one on each line).

Signed and Sealed this

Sixteenth Day of January, 1996

Attest:

BRUCE LEHMAN

*Attesting Officer*    Commissioner of Patents and Trademarks